United States Patent [19]

Tsuji et al.

[11] Patent Number: 5,317,189
[45] Date of Patent: May 31, 1994

[54] AXIAL LEAD FRAME

[75] Inventors: Kazuyoshi Tsuji; Eiji Shimazaki, both of Kyoto, Japan

[73] Assignee: Rohm Co., Ltd., Kyoto, Japan

[21] Appl. No.: 27,371

[22] Filed: Mar. 9, 1993

[30] Foreign Application Priority Data

Jun. 29, 1992 [JP] Japan .................. 4-196316

[51] Int. Cl.$^5$ .................... H01L 23/48; H01L 29/40; H01L 23/02; H01L 23/12
[52] U.S. Cl. .................... 257/694; 257/666; 257/667; 257/670; 257/692; 257/459; 257/786
[58] Field of Search .............. 257/666, 667, 670, 692, 257/459, 786, 694

[56] References Cited

U.S. PATENT DOCUMENTS

| | | | |
|---|---|---|---|
| 4,694,183 | 9/1987 | Merrick et al. | 250/551 |
| 4,984,057 | 1/1991 | Mii | 357/68 |

FOREIGN PATENT DOCUMENTS

| | | | |
|---|---|---|---|
| 55-12791 | 1/1980 | Japan | 257/666 |
| 59-80957 | 5/1984 | Japan | 257/692 |
| 59-92554 | 5/1984 | Japan | 257/692 |
| 1295451 | 11/1989 | Japan | 257/666 |

OTHER PUBLICATIONS

W. E. Dougherty, Connection of Discrete Leads to Packaged Circuits, Jan. 1972, 2435, IBM TDB.

Primary Examiner—Jerome Jackson
Assistant Examiner—T. M. Arroyo
Attorney, Agent, or Firm—Brumbaugh, Graves, Donohue & Raymond

[57] ABSTRACT

An axial lead frame including two side rails arranged opposite to each other and plural pairs of lead terminals separated from each other and located opposite to each other, in which a longer lead terminal and a shorter lead terminal of a pair of the lead terminals are alternately arranged to extend in parallel with each other in the equally spaced relationship between both side rails. And, a buffer member is formed at the substantially central part between both the side rails so as to allow the longer lead terminals extending from both the side rails toward the buffer member to be jointed to each other along the buffer member. A die pad is die-bonded to the foremost end of each of the longer lead terminal, while a pad is placed at the foremost end of each of the shorter lead terminal. Dam bars are bridged between adjacent lead terminals in order to prevent molten resin from flowing out during molding operation.

3 Claims, 2 Drawing Sheets

AXIAL LEAD FRAME

BACKGROUND OF THE INVENTION

The present invention relates generally to an axial lead frame. More particularly, the present invention relates to a contour to be assumed by an axial lead frame which is used for the purpose of producing electronic components each having two poles located opposite to each other, e.g., diode devices, light emitting diode devices or the like.

A contour assumed by a conventional axial lead frame (hereinafter referred to simply as a lead frame) of the foregoing type will be described below with reference to FIG. 3 with respect to a lead frame to be used for producing diode devices.

The lead frame designated by reference numeral 1 includes two side rails 3 and 4 located opposite to each other, and a plurality of joint pieces 2 arranged in the equally spaced relationship in the longitudinal direction are bridged between both the side rails 3 and 4. In addition, a predetermined number of lead terminals 5 and 6 (each six terminals in the shown case) separated from each other and located opposite to each other are arranged in the equally spaced relationship to extend in parallel with each other in each segment defined by adjacent joint pieces 2. A die pad 7 is formed at the foremost end of each lead terminal 5 for the purpose of die-bonding a diode element thereto, while a pad 8 is formed at the foremost end of each lead terminal 6 for the purpose of connecting thereto one end of a fine metallic lead wire connected to the corresponding diode element. Generally, the lead frame 1 contoured in the aforementioned manner is produced by employing a punching process using a punching die.

Next, a procedure of producing a diode device using the lead frame 1 will be described below.

First, a diode element is die-bonded to each die pad 7, and subsequently, the diode element die-bonded in that way is connected to the corresponding pad 8 via a fine metallic lead wire. On completion of the connecting operation, an assembly consisting of one segment of the lead frame 1, diode elements die-bonded to pads 8 and fine metallic lead wires is subjected to molding as illustrated by phantom lines R in FIG. 3. To test electrical properties of each diode device produced in that way, one of the lead terminals 5 or 6 is cut off from the side rail 3 or 4. Testing is executed with the diode device by connecting a common measuring pin to the side rail 3 or 4 which holds lead terminals 5 or 6 without any connection to the diode device and then connecting another measuring pin to the lead 5 or 6 which is cut off therefrom. On completion of the testing, the lead terminal 5 or 6 which is not connected to the diode device which has been confirmed as an acceptable one is cut off from the side rail 3 or 4.

With resect to the conventional lead frame constructed in the above-described manner, however, the following problems have been arisen.

With the conventional lead frame 1, a plurality of joint pieces 2 should be arranged in the equally spaced relationship in the longitudinal direction for connecting the side rails 3 and 4 to each other which hold plural pairs of lead terminals 5 and 6 separated from each other. For this reason, the number of diode devices obtainable per a unit length of the lead frame 1 is unavoidably restricted. Thus, there arises a problem that each diode device is produced not only at an expensive material cost but also at an expensive production cost. When each joint piece 2 is designed to have a smaller width or a pitch between adjacent joint pieces 2 is elongated in order to increase the number of diode devices obtainable per a unit length of the lead frame 1, there arises another problem that the joint strength of the lead frame 1 is undesirably reduced.

As mentioned above, the lead frame 1 is generally produced by employing a punching process using a punching die, and the punching die includes punches each adapted to repeatedly punch a pattern enclosed by the phantom lines R (consisting of a single joint piece 2 and plural pairs of lead terminals 5 and 6 arranged in the equally spaced relationship to extend in parallel with each other in the space defined between adjacent joint pieces 2) as shown in FIG. 3. Thus, each lead frame 1 having a plurality of patterns each having a same contour successively arranged in the longitudinal direction is produced by simultaneously punching them from a metallic sheet material in the punching die. Due to the fact that the conventional lead frame 1 includes a plurality of joint pieces 2 arranged in the equally spaced relationship in the longitudinal direction, a pitch between adjacent joint pieces 2 is elongated, and moreover, the number of punches required for the punching die increases correspondingly. Thus, there arises another problem that the punching die becomes complicated in structure, resulting in it being produced at an expensive cost.

SUMMARY OF THE INVENTION

The present invention has been made in consideration of the aforementioned problems and its object resides in providing an axial lead frame which assures that a cost required for producing a product of axial lead frame can be reduced.

To accomplish the above object, the present invention provides an axial lead frame which is constructed in the following manner.

Specifically, according to the present invention, there is provided an axial lead frame including two side rails arranged opposite to each other; plural pairs of lead terminals separated from each other and located opposite to each other, the lead terminals each consisting of a longer lead terminal having a longer length and a shorter lead terminal having a shorter length being alternately arranged to extend in parallel with each other with a equally spaced relationship in the longitudinal direction in a space defined between the side rails; and a buffer member formed at a substantially central part between the side rails so as to allow the lead terminals each having a longer length and extending from the side rails toward the buffer member to be jointed to each other along the buffer member.

A function attainable based on the present invention will be described below.

With the axial lead frame constructed according to the present invention, one of each pair of lead terminals is formed to have a length longer than that of other one of the lead terminals, the lead terminal having a longer length and the lead terminal having a shorter length are alternately arranged to extend in parallel with each other, and a buffer member is formed at the substantially central part between both the side rails so as to allow lead terminals each having a longer length and extending from both the side rails toward the buffer member to be jointed to each other along the buffer member. With this construction, lead terminals each having a longer length and extending from both the side rails are jointed to each other with the buffer member interposed between both the side rails, whereby a product of axial lead frame can be produced by simultaneously forming a plurality of patterns each having a predetermined number of pitches each defined between adjacent lead terminals.

DETAILED DESCRIPTION OF THE PREFERRED EMBODIMENT

The present invention will now be described in detail hereinafter with reference to the accompanying drawings which illustrate a preferred embodiment thereof.

Figure 1:
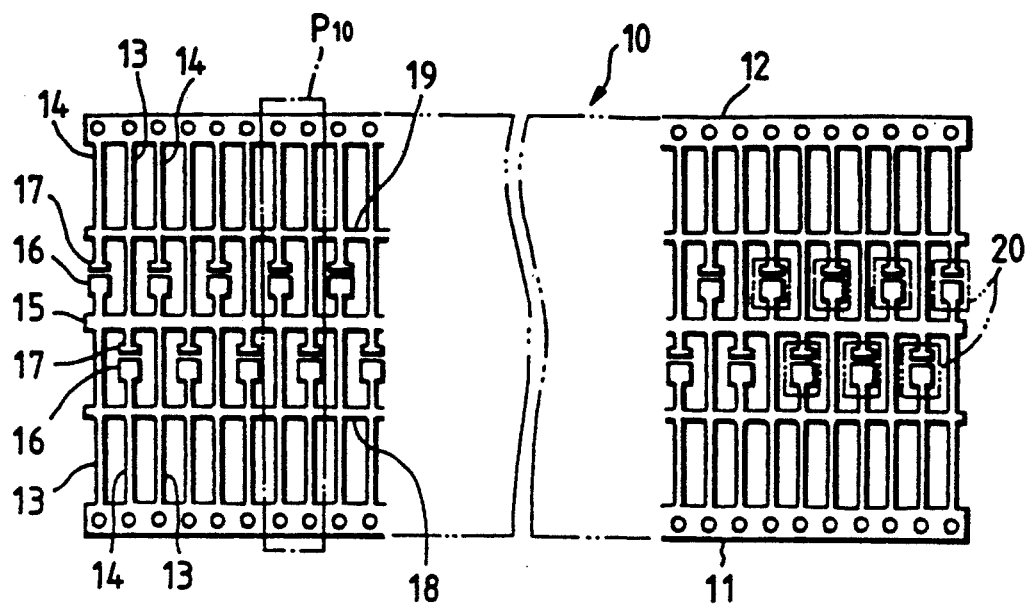
FIG. 1 is a plan view of an axial lead frame in accordance with an embodiment of the present invention.

FIG. 1 is a plan view of an axial lead frame usable for producing diode devices wherein illustration of some part of the axial lead frame is neglected for simplification. In this embodiment, an axial lead frame usable for producing diode devices has been described below as an example.

As shown in FIG. 1, the lead frame designated by reference numeral 10 is constructed such that two rows of plural pairs of one lead terminal 13 having a long, length (hereinafter referred to as a long lead terminal) and another lead terminal 14 having a short length (hereinafter referred to as a short lead terminal) alternately arranged and separated from each other are alternately arranged in the equally spaced relationship in the longitudinal direction while they are supported by side rails 11 and 12 with a longitudinally extending buffer member 15 interposed at the substantially central part between both the side rails 11 and 12.

With respect to the plural pairs of lead terminals 13 and 14, die pads 16 are formed at the foremost ends of the lead terminals 13 and 14 extending from the side rail 11 (and the lead terminals 13 and 14 are alternately supported by the side rail 11 for the purpose of die-bonding diode elements thereto. On the other hand, pads 17 are formed at the foremost ends of the lead terminals 13 and 14 extending from the side rail 14 for the purpose of connecting thereto fine metallic lead wires of which one ends are connected to the diode elements. In addition, a dam bar 18 is bridged between adjacent lead terminals 13 and 14 extending from the side rail 11 at the position located between the side rail 11 and the die pad 16 formed on the short lead terminal 14 in order to prevent molten resin from flowing out during each molding operation. Likewise, a dam bar 19 is bridged between adjacent lead terminals 13 and 14 extending from the side rail 12 at the position located between the side rail 12 and the pad 17 formed on the short lead terminal 14 in order to prevent molten resin from flowing out during each molding operation.

The lead frame 10 contoured in the above-described manner is produced by forming a plurality of patterns $P_{10}$ each corresponding to two pitches each defined between adjacent lead terminals 13 and 14. Generally, the lead frame 10 is produced by employing a punching process using a punching die. It is essential that the punching die employed for practicing the punching process includes a plurality of punches of which number is determined so as to enable at least a series of patterns $P_{10}$ to be simultaneously formed.

Next, a procedure of producing diode devices using the lead frame 10 will be described below.

Figure 2:
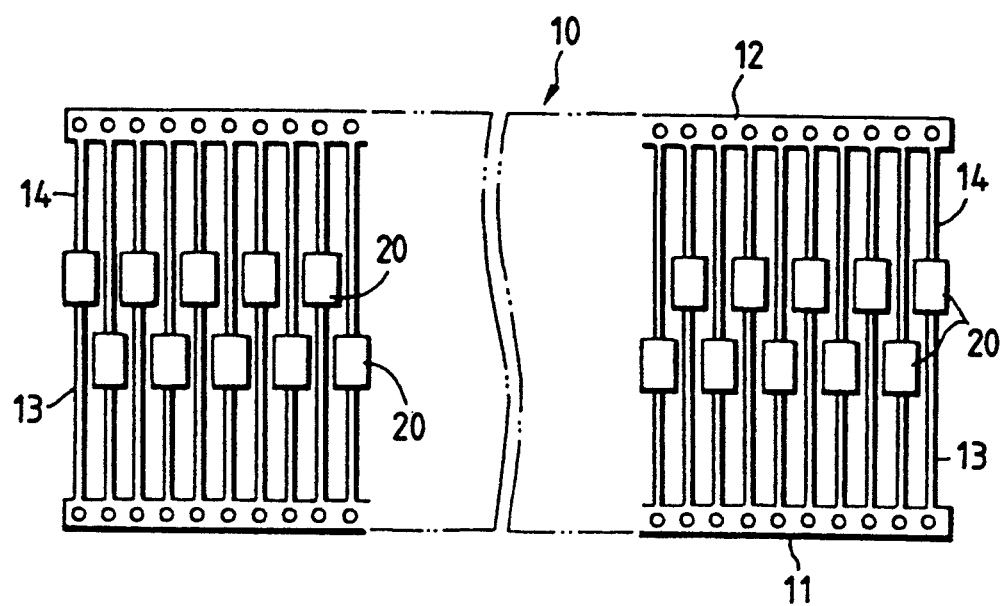
FIG. 2 is a plan view of the axial lead frame shown in FIG. 1, in the case of that a buffer member and dam bars are cut off from respective diode devices for electrical characteristic test.
Figure 3:
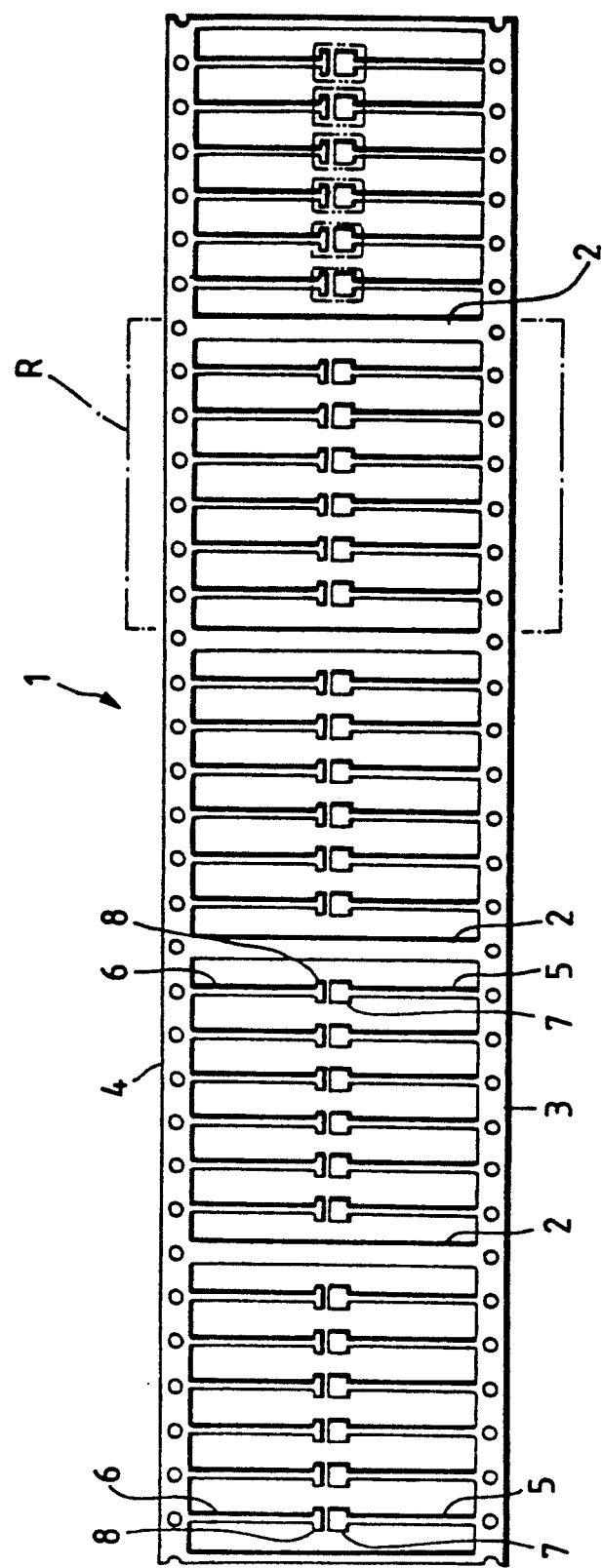
FIG. 3 is a plan view of a conventional axial lead frame.

First, diode elements are die-bonded to the respective pads 16, and thereafter, the diode elements die-bonded pads 16 in that way are connected to the pads 17 located opposite thereto via fine metallic lead wires. Subsequently, an assembly consisting of diode elements, pads and fine metallic lead wires is subjected to molding as illustrated by phantom lines in FIG. 1. On completion of the molding operation, a plurality of molded portions 20 are arranged on the lead frame 10 while exhibiting a zigzag pattern. To test electrical properties of each diode device produced in the above-described manner, the buffer member 15 and the dam bars 18 and 19 are cut off from the molded portions 20 (see FIG. 2). Next, the lead terminals 13 and 14 extending from the side rail 11 or 12 are cut off from the latter. Testing is executed with the lead frame 10 by connecting a common measuring pin to the side rail 11 or 12 which is not connected to the diode device and then connecting other measuring pin to the lead terminals 13 and 14 which are cut off from the side rail 11 or 12. After completion of the testing operation, the lead terminals 13 and 14 are cut off from the side rail 11 or 12 which are not connected to the diode device which has been confirmed as an acceptable one, and thereafter, the respective diode devices are cut off from the lead frame 10.

In this embodiment, the dam bars 18 and 19 are additionally formed for the lead frame 10. In practice, the dam bars 18 and 19 serve to prevent molten resin from dispersively flowing out from an injection molding die at a molding step. The desired joint strength of the lead frame 1 can sufficiently be obtained merely with the buffer member 15. Although the present invention has been described above with respect to the embodiment wherein a product of axial lead frame is used for the purpose of producing diode devices, it should of course be understood that the present invention should not be limited only to this embodiment but it may equally be applied to an axial lead frame which is used for the purpose of producing various kinds of electronic components each having such a contour that two electrodes are arranged opposite to each other.

As is apparent from the above description, according to the present invention, both the side rails are jointed to each other via a plurality of lead terminals each having a long length with the aid of the buffer member interposed between both the side rails, and plural pairs of lead terminals are arranged in the equally spaced relationship in the longitudinal direction to extend in parallel with each other in the space defined between both the side rails. Consequently, the number of products, e.g., diode devices obtainable from the lead frame per a unit length of the latter can substantially be increased at a high efficiency. In addition, since lead terminals each having a long length and lead frames each having a short length are alternately arranged as seen in the longitudinal direction, a plurality of molded portions are formed on the lead frame while exhibiting a zigzag contour. Thus, a pitch between adjacent lead terminals can be designed without any particular restriction attributable to dimensions of each molded portion, and moreover, the number of products obtainable from a single lead frame can be increased. Since the contour of the lead frame can be built merely by simultaneous formation of a plurality of predetermined patterns, a punching die required for producing the lead frame can be simplified. Consequently, products, e.g., diode devices can be produced at a substantially reduced cost.

What is claimed is:

1. An axial lead frame for producing an electronic component having two poles located opposite to each other, comprising;

two side rails arranged opposite to each other;

plural pairs of lead terminals, each pair extending in aligned relation from the opposite side rails, respectively, the lead terminals of each aligned pair consisting of a longer lead terminal having a longer length and a shorter lead terminal having a shorter length with the locations of the longer and shorter lead terminals being reversed in adjacent pairs and the pairs being arranged to extend in parallel with each other with equally spaced relationship in the direction of the side rails and located in a space defined between said side rails; and a buffer member formed at a substantially central location between said side rails so as to allow each of said longer lead terminals to be joined to each other along said buffer member.

2. An axial lead frame according to claim 1 further comprising;

a plurality of die pads for die-bonding said electronic component, said die pads being formed at the ends of said lead terminals extending from one of said two side rails; and a plurality of wire bonding pads for connecting a fine metallic lead wire to said electronic component, said wire bonding pads being formed at the ends of said lead terminals extending from the other of said two side rails.

3. An axial lead frame according to claim 2 further comprising;

a first dam bar bridged between adjacent lead terminals extending from said one of said two side rails at a position located between said one of two side rails and said die pad formed on said shorter lead terminal in order to prevent molten resin from flowing out during the molding operation;

a second dam bar bridged between adjacent lead terminals extending from said other of said two side rails at a position located between said other of said two side rails and said wire bonding pad formed on said shorter lead terminal in order to prevent molten resin from flowing out during the molding operation.

* * * * *